(12) United States Patent
Hsieh et al.

(10) Patent No.: US 8,427,240 B2
(45) Date of Patent: Apr. 23, 2013

(54) LOW-NOISE AMPLIFIER WITH GAIN ENHANCEMENT

(75) Inventors: Hsieh-Hung Hsieh, Taipei (TW); Po-Yi Wu, Baoshan (TW); Ho-Hsiang Chen, Hsinchu (TW); Chewn-Pu Jou, Chutung (TW); Fu-Lung Hsueh, Cranbury, NJ (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 183 days.

(21) Appl. No.: 12/968,342

(22) Filed: Dec. 15, 2010

(65) Prior Publication Data

US 2012/0032743 A1 Feb. 9, 2012

Related U.S. Application Data

(63) Continuation-in-part of application No. 12/851,705, filed on Aug. 6, 2010, now Pat. No. 8,279,008.

(51) Int. Cl.
*H03F 3/04* (2006.01)

(52) U.S. Cl.
USPC .................. 330/311; 330/310; 330/278

(58) Field of Classification Search ............ 330/311, 330/310, 278
See application file for complete search history.

(56) References Cited

U.S. PATENT DOCUMENTS

| 5,015,968 | A * | 5/1991 | Podell et al. ............ 330/277 |
| 7,403,071 | B2 | 7/2008 | Hollenbeck et al. |
| 7,488,995 | B2 | 2/2009 | Usami et al. |
| 7,629,850 | B2 | 12/2009 | Floyd et al. |
| 7,960,916 | B2 * | 6/2011 | Kawachi ............ 315/34 |
| 2007/0115063 | A1 * | 5/2007 | Lee et al. ............ 330/302 |
| 2007/0273445 | A1 | 11/2007 | Sarkar et al. |
| 2008/0297262 | A1 * | 12/2008 | Duster et al. ............ 330/311 |

OTHER PUBLICATIONS

Natarajan, A. et al., "A 60GHz Variable-Gain LNA in 65 nm CMOS", IEEE Asian Solid State Circuits Conference, Nov. 3-5, 2008, Fukuoka, Japan, 4 pages.
Hsieh, H.H., "A 40-GHz Low-Noise Amplifier With a Positive-Feedback Network in 0.18-μm CMOS", IEEE Transactions on Microwave Theory and Techniques, Aug. 2009, 57(8):1895-1902.
Mimino, Y. et al., "A 60 GHz Millimeter-wave MMIC Chipset for Broadband Wireless Access System Front-end", IEEE MTT-S Digest, 2002, TH3A-2, pp. 1721-1724.
Pellerano, S. et al., "A 64GHz 6.5dB NF 15.5dB Gain LNA in 90nm CMOS", IEEE Solid State Circuits Conference, Sep. 2007, pp. 352-355.
Yao, T. et al., Algorithmic Design of CMOS LNAs and PAs for 60-GHz Radio, IEEE Journal of Solid-State Circuits, May 2007, 42(5):1044-1057.
Doan, C.H. et al., "Millimeter-Wave CMOS Design", IEEE Journal of Solid-State Circuits, Jan. 2005, 40(1):144-155.
Nishikawa, K. et al., "0.4 V, 5.6 mW InP HEMT V-band Low-Noise Amplifier MMIC", Microwave Symposium Digest, Jun. 2006, pp. 810-813.

(Continued)

*Primary Examiner* — Patricia Nguyen
(74) *Attorney, Agent, or Firm* — Duane Morris LLP

(57) ABSTRACT

A low-noise amplifier ("LNA") includes a first cascode gain stage including a first complementary metal oxide semiconductor ("CMOS") transistor configured to receive a radio frequency ("RF") input signal and a second CMOS transistor coupled to an output node. The first inductive gate network is coupled to a gate of the second CMOS transistor for increasing a gain of the first cascode gain stage. The first inductive gate network has a non-zero inductive input impedance and includes at least one passive circuit element.

19 Claims, 20 Drawing Sheets

OTHER PUBLICATIONS

Fujihara, A. et al., "High Performance 60-GHz Coplanar MMIC LNA Using InP Heterojunction FETs with AIAs/InAs Superlattice Layer", IEEE MTT-S Digest, 2000, TU2A-4, pp. 21-24.

Handa, S. et al., "60GHz-band Low Noise Amplifier and Power Amplifier Using InGaP/GaAs HBT Technology", IEEE GaAs Digest, 2003, pp. 227-230.

* cited by examiner

LOW-NOISE AMPLIFIER WITH GAIN ENHANCEMENT

CROSS-REFERENCE TO RELATED APPLICATIONS

This application is a continuation-in-part of U.S. patent application Ser. No. 12/851,705, which was filed on Aug. 6, 2010, the entirety of which is herein incorporated by reference.

FIELD

The disclosed circuits and methods relate to millimeter wave receivers. More specifically, the disclosed circuits and methods relate to millimeter wave receivers including a low noise amplifiers having gain enhancement.

BACKGROUND

Millimeter-wave frequencies generally refer to signals in the frequency band between approximately 30 GHz to 300 GHz, which are frequently used in various applications such as wireless personal area networks ("WPANs"), automobile radar, and image sensing. Various LNAs for millimeter waves have been disclosed. For example, millimeter-wave LNAs were initially implemented in Group III-V compound semiconductors or implemented using cascode amplifiers based on bipolar junction transistor ("BJT") technology. However, LNAs implemented using compound III-V semiconductors or BJTs are not easily integrated with the other components of the receiver, especially for digital circuits, resulting in higher implementation costs.

Recent advances in complementary metal oxide semiconductor ("CMOS") technologies have enabled millimeter-wave integrated circuits to be implemented at lower costs as multi-stage LNAs. However, these multi-stage LNAs experience passive losses across the input, inter-stage, and output matching networks, which lead to insufficient gain. Consequently, the amplitude of the amplified signal after the LNA is too small to be accurately processed by the rest of the circuitry of a receiver.

DETAILED DESCRIPTION

Being the first active receiver circuit after the antenna, the low-noise amplifier ("LNA") is a critical building block for radio transceivers as it impacts both ends of the dynamic range of the receiver. To improve receiver sensitivity or reduce receiver noise figure, LNAs are implemented with low noise figures and high-power gains to further deemphasize noise contributions downstream in the receiver.

Figure 1:
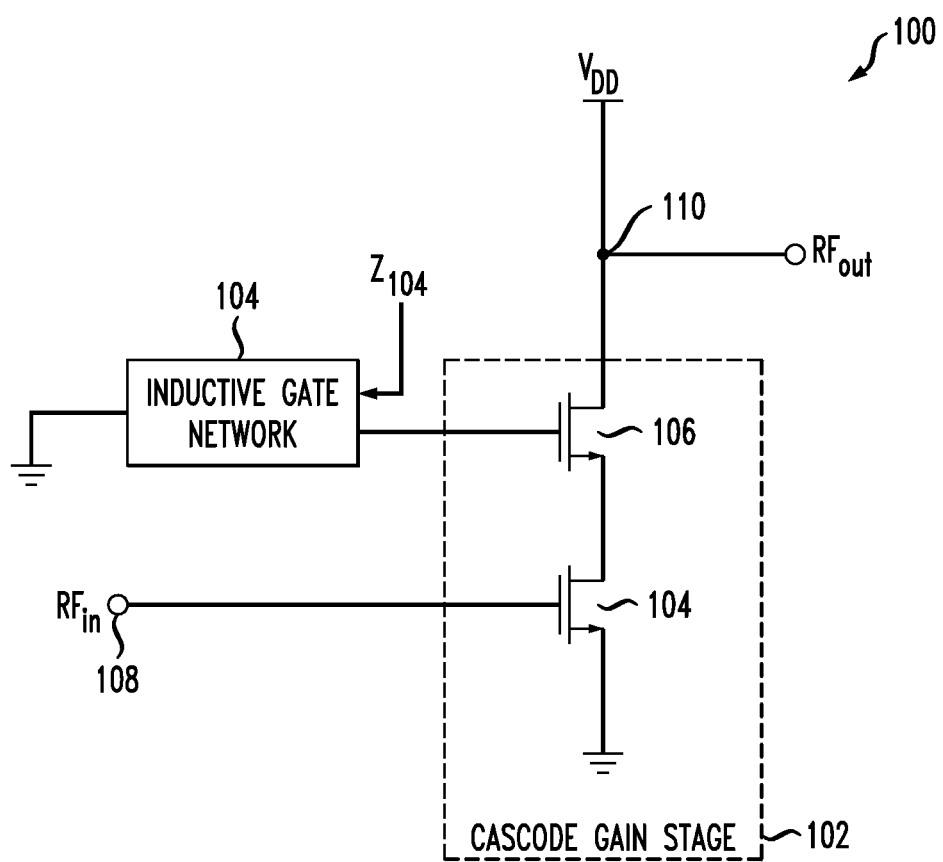
FIG. 1 is a block diagram of one example of an improved low-noise amplifier.

FIG. 1 is a block diagram of one example of an improved LNA 100 including a cascode gain stage 102 having a common source transistor 112 having its drain coupled to the source of a common gate transistor 106. Each of the circuit elements of LNA 100 may be implemented using complementary metal oxide semiconductor ("CMOS") technology. A radio frequency ("RF") input signal is received at node 108, which is coupled to the gate of common source transistor 112. The output of LNA 100 is taken from node 110, which is coupled between an operating voltage source $V_{DD}$ and the drain of common gate transistor 106.

An inductive gate network 104 having a non-zero input impedance $Z_{104}$ is coupled to the gate of the common gate transistor 106 and includes one or more passive circuit devices or elements. For example, inductive gate network 104 may include resistors, capacitors, inductors, varactors, inductive transmission lines, and combinations thereof as will be understood by one skilled in the art after reading the following description. Coupling the inductive gate network 104 to the gate of common gate transistor 106 advantageously increases the gain performance of LNA 100 without requiring additional direct current ("DC") power consumption since inductive gate network 104 includes passive components.

Figure 2A:
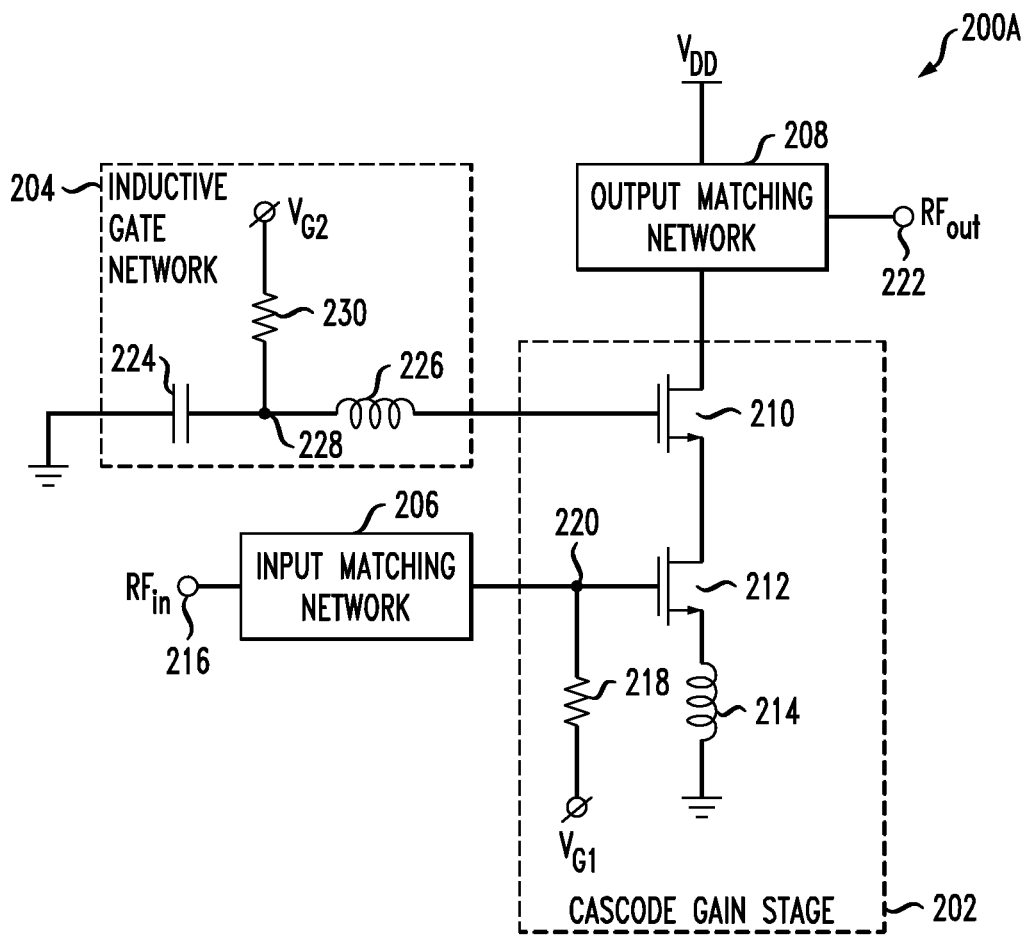
FIG. 2A is a schematic diagram of one example of an improved single-stage low-noise amplifier including an inductive gate network.

FIGS. 2A-2E are schematic diagrams of various embodiments of LNAs that include inductive gate networks coupled to the gate of a common gate transistor of a cascode gain stage. Turning first to FIG. 2A, LNA 200A includes a single cascode gain stage 202, an inductive gate network 204, an input matching network 206, and an output matching network 208. Cascode gain stage 202 includes a common gate transistor 210 having its source coupled to a drain of a common source transistor 212, which has its source coupled to ground through inductor 214. The gate of common source transistor 212 is coupled to an input node 216 for receiving an RF input signal through input matching network 206. A resistor 218 may be coupled to node 220 disposed between input matching network 206 and the gate of common source transistor 212a and to voltage source node $V_{G1}$ for biasing the gate voltage of common source transistor 212.

The gate of common gate transistor 210 is coupled to ground through inductive gate network 204, and the drain of common gate transistor 210 is coupled to an output node 222 through output matching network 208, which may be coupled to a voltage supply node set at $V_{DD}$. In the embodiment illustrated in FIG. 2A, inductive gate network 204 includes a capacitor 224 coupled to the gate of common gate transistor 210 through inductor 226. Coupled to node 228 disposed between capacitor 224 and inductor 226 is resistor 230, which is coupled to a biasing voltage $V_{G2}$.

Figure 2B:
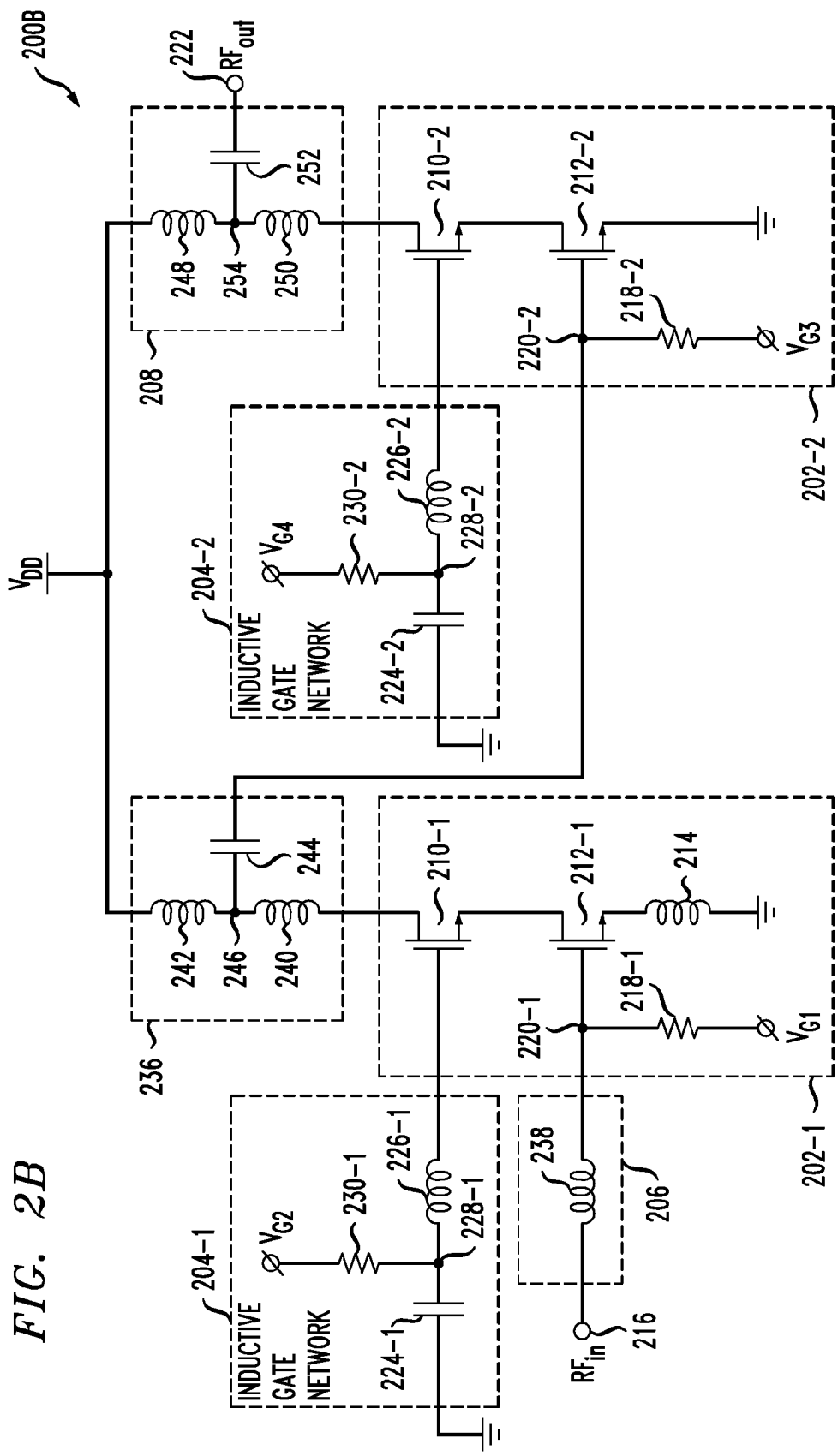
FIG. 2B is a schematic diagram of one example of an improved two-stage low-noise amplifier with each stage including an inductive gate network.

The single-stage LNA 200A may be cascaded to provide a multiple stage LNA. For example, FIG. 2B illustrates an LNA 200B having two cascode gain stages 202-1 and 202-2. Each of the cascode gain stages 202-1, 202-2 includes a common-gate transistor 210-1, 210-2 having a source coupled to a drain of a common source transistor 212-1, 212-2. The gates of the common gate transistors 210-1, 210-2 are coupled to ground through an inductive gate network 204-1, 204-2.

Common source transistor 212-1 has its source coupled to ground through an inductor 214, and its gate coupled to an input node 216 configured to receive an RF input signal through an input matching network 206. A resistor 218-1 is coupled between a gate biasing voltage $V_{G1}$ and a node 220-1 disposed between the gate of common source transistor 212-1 and the input matching network 206. Common source transistor 212-2 has its source coupled to ground and its gate coupled to inter-stage matching network 236, which is also coupled to the drain of common gate transistor 210-1. A resistor 218-2 is coupled between a biasing voltage $V_{G3}$ and node 220-2, which is disposed between the gate of common source transistor 212-2 and the inter-stage matching network 236.

Each inductive gate network 204-1, 204-2 includes a capacitor 224-1, 224-2 coupled to the gate of common gate transistor 210-1, 210-2 through inductor 226-1, 226-2. Resistors 230-1, 230-2 are respectively coupled to a biasing voltage $V_{G2}$, $V_{G4}$ and to a node 228-1, 228-2, which is disposed between capacitor 224-1, 224-2 and inductor 226-1, 226-2.

Input matching network 206 may include a single inductor 238, although one skilled in the art will understand that input matching network may include a plurality of inductors as well as one or more capacitors to form an LC ladder. Inter-stage matching network 236 includes an LC ladder comprising a first inductor 240 coupled to the drain of common gate transistor 210-1 and a second inductor 242 coupled to the first inductor 240 and to a voltage supply node set at $V_{DD}$.

Capacitor 244 is coupled to the gate of common source transistor 212-2 of the second cascode gain stage 202-2 and to node 246, which is disposed between inductors 240 and 242. Output matching network 208 includes an inductor 248 coupled to voltage source node $V_{DD}$ and to another inductor 250, which is coupled to the drain of common gate transistor 210-2. Capacitor 252 is coupled to output node 222 and to node 254, which is disposed between inductors 248 and 250.

Figure 2C:
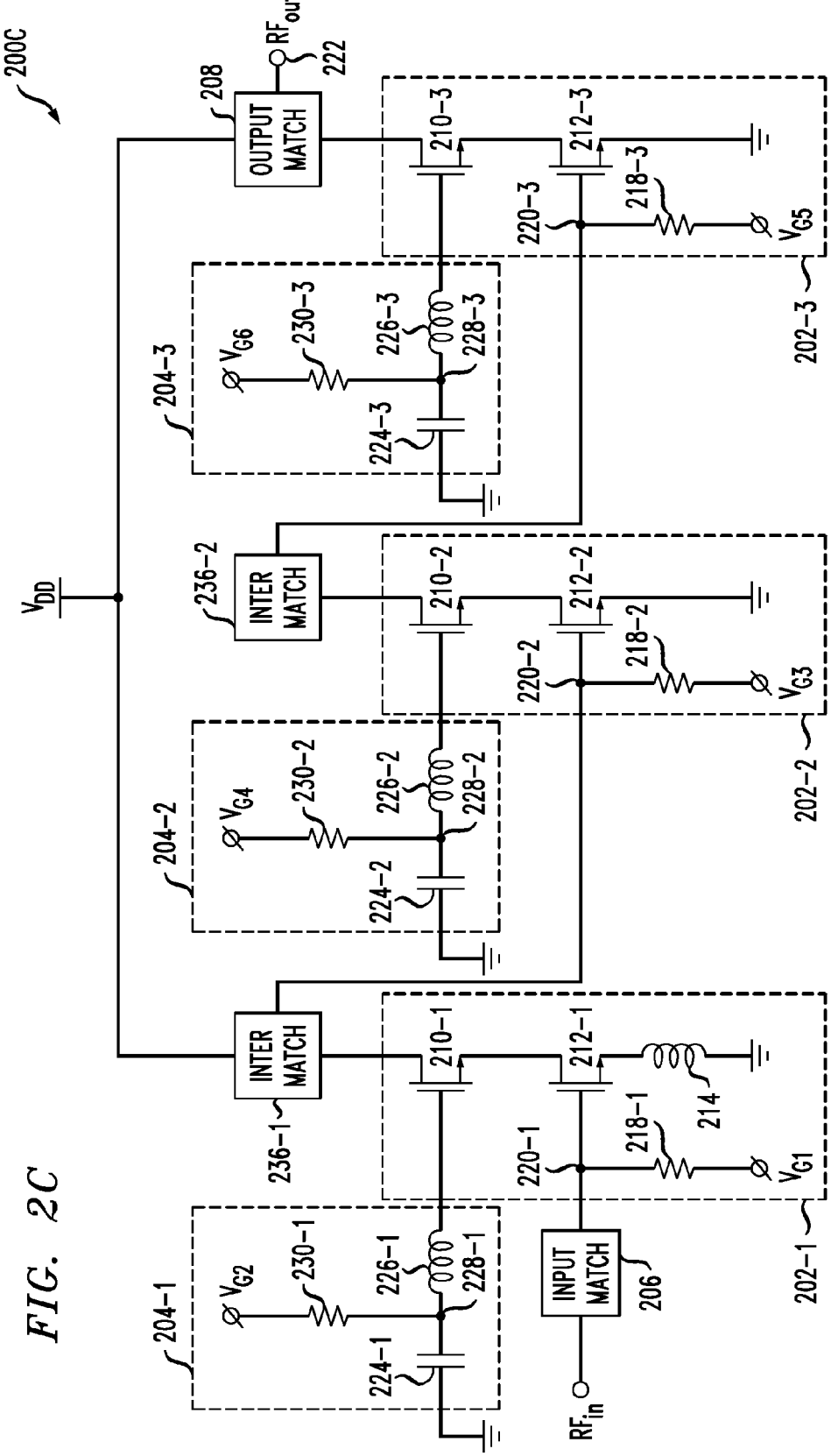
FIG. 2C is a schematic diagram of one example of an improved three-stage low-noise amplifier with each stage including an inductive gate network.

One skilled in the art will understand that the number of cascaded cascode stages is not limited to two. For example, FIG. 2C illustrates a three stage LNA 200C including three cascode gain stages 202-1, 202-2, and 202-3 each coupled to a respective inductive gate network 204-1, 204-2, and 204-3. The descriptions of components of LNA 200C that are the same as those of LNA 200B are not repeated.

Figure 2D:
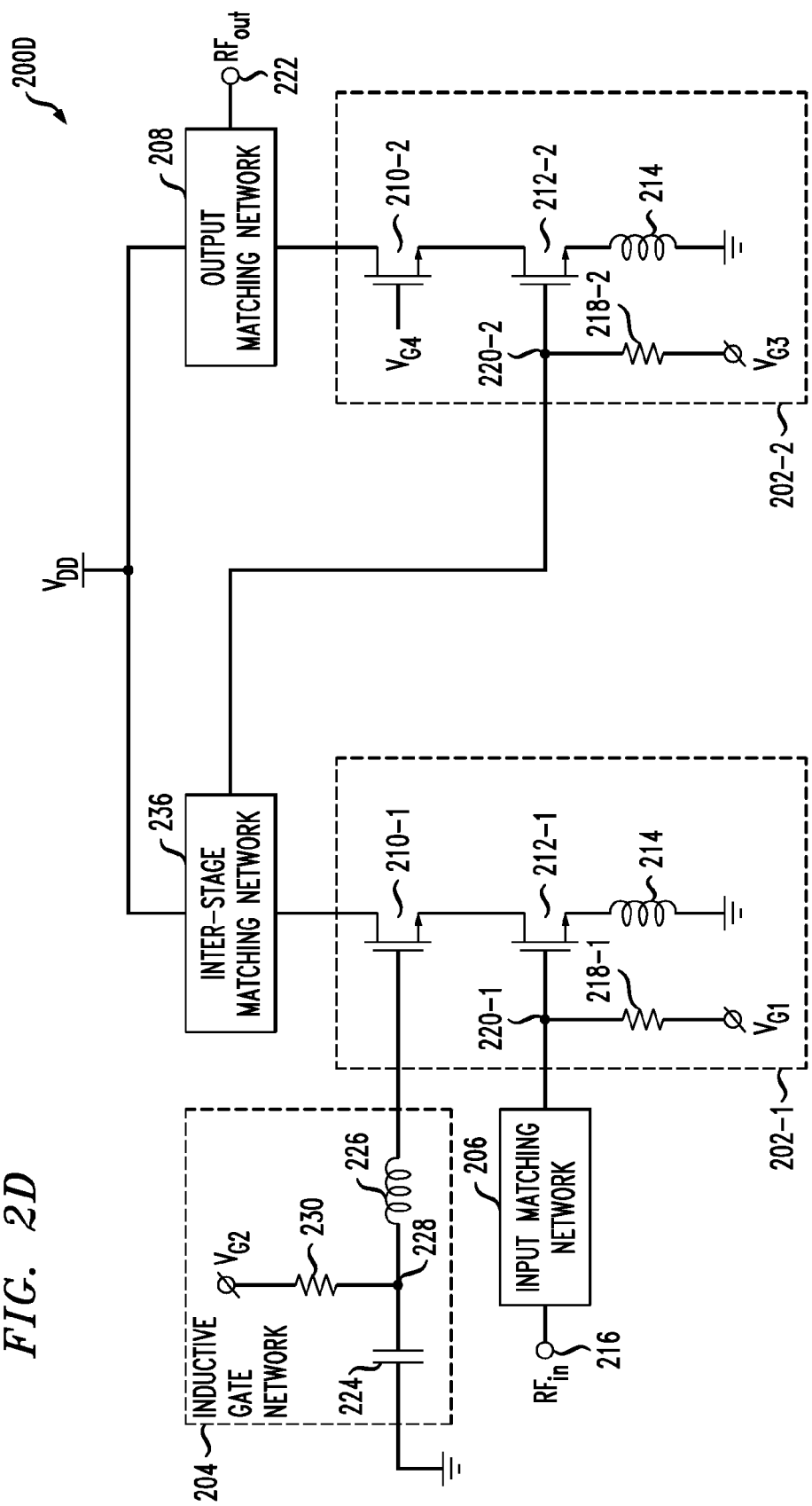
FIG. 2D is a schematic diagram of another example of an improved two-stage low-noise amplifier with only one stage including an inductive gate network.
Figure 2E:
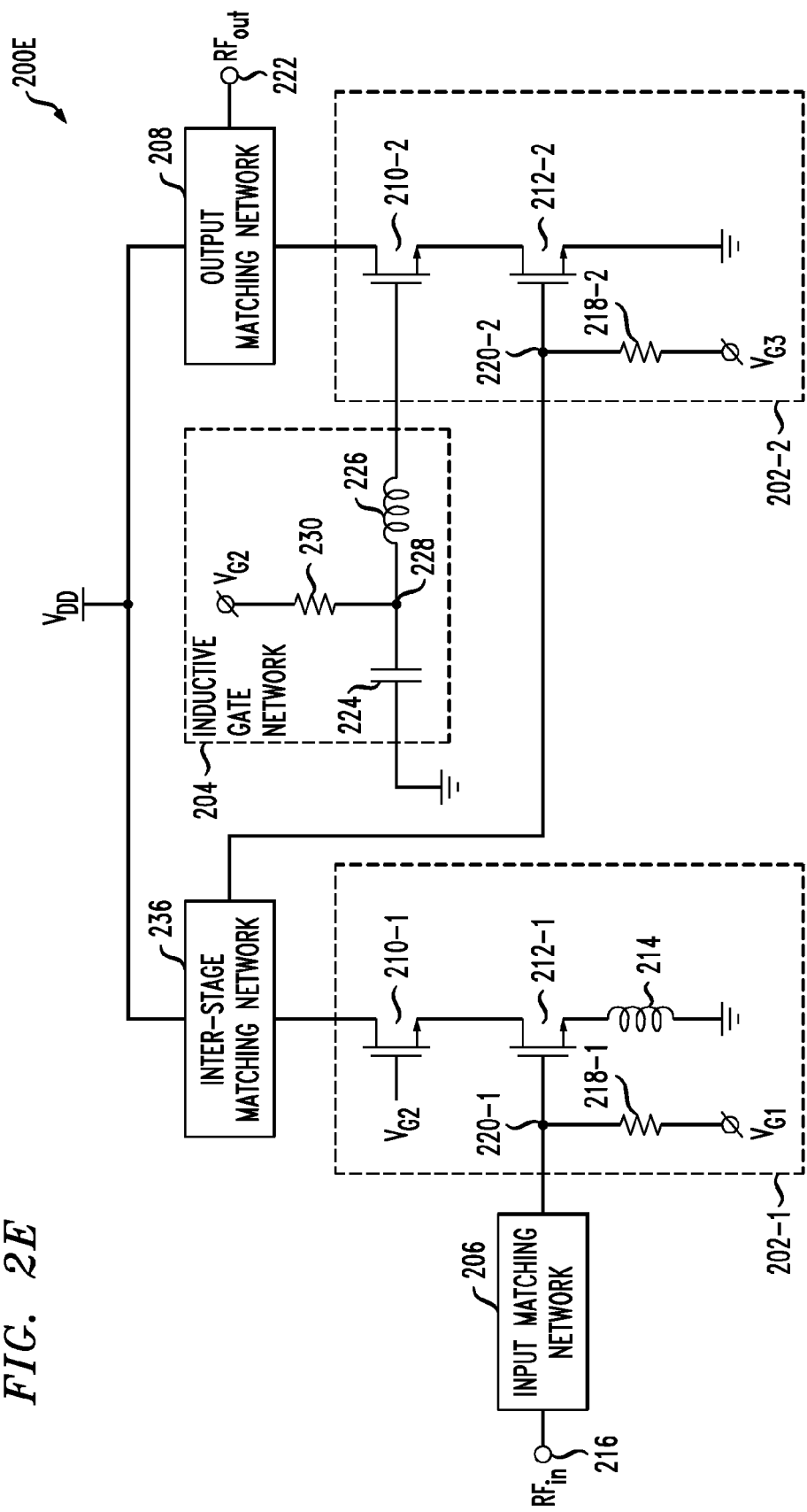
FIG. 2E is a schematic diagram of another example of an improved two-stage low-noise amplifier with only one stage including an inductive gate network.

In some embodiments, an improved LNA may be implemented with a plurality of cascode gain stages 202 with only one of the cascode gain stages being coupled to an inductive gate network 204. For example, FIG. 2D illustrates one example of an LNA 200D including two cascode gain stages 202-1 and 202-2 with an inductive gate network 204 coupled to cascode gain stage 202-1. FIG. 2E illustrates another example of an LNA 200E including two cascode gain stages 202-1 and 202-2 with an inductive gate network coupled to cascode gain stage 202-2. Accordingly, one skilled in the art will understand that the number of cascode gain stages 202 and inductive gate networks 204 may be varied as may the cascode gain stage 202 to which a inductive gate stage 204 may be coupled.

In operation, the single stage LNA 200A receives an input signal at input node 216 and LNA 200A amplifies the received RF signal. Inductive gate network 204 coupled to the gate of common gate transistor 210 increases the gain of cascode gain stage 202 compared to cascode gain stages without an inductive gate network coupled to the gate of the common gate transistor. Advantageously, this increase in gain is achieved using passive components without requiring additional DC power.

Although the inductive gate network is illustrated in FIGS. 2A-2E as including a inductor coupled to a capacitor in series with a resistor coupled to a bias voltage node and to a node disposed between the capacitor and inductor, one skilled in the art will understand that the inductive networks may have different layouts and/or include different passive devices. For example, FIGS. 3-6 illustrates various embodiments of gate networks that may be implemented in which elements of the LNAs that are similar to elements in FIG. 2A have the same reference numeral increased by 100, 200, 300, etc. Descriptions of like elements are not repeated.

Figure 3:
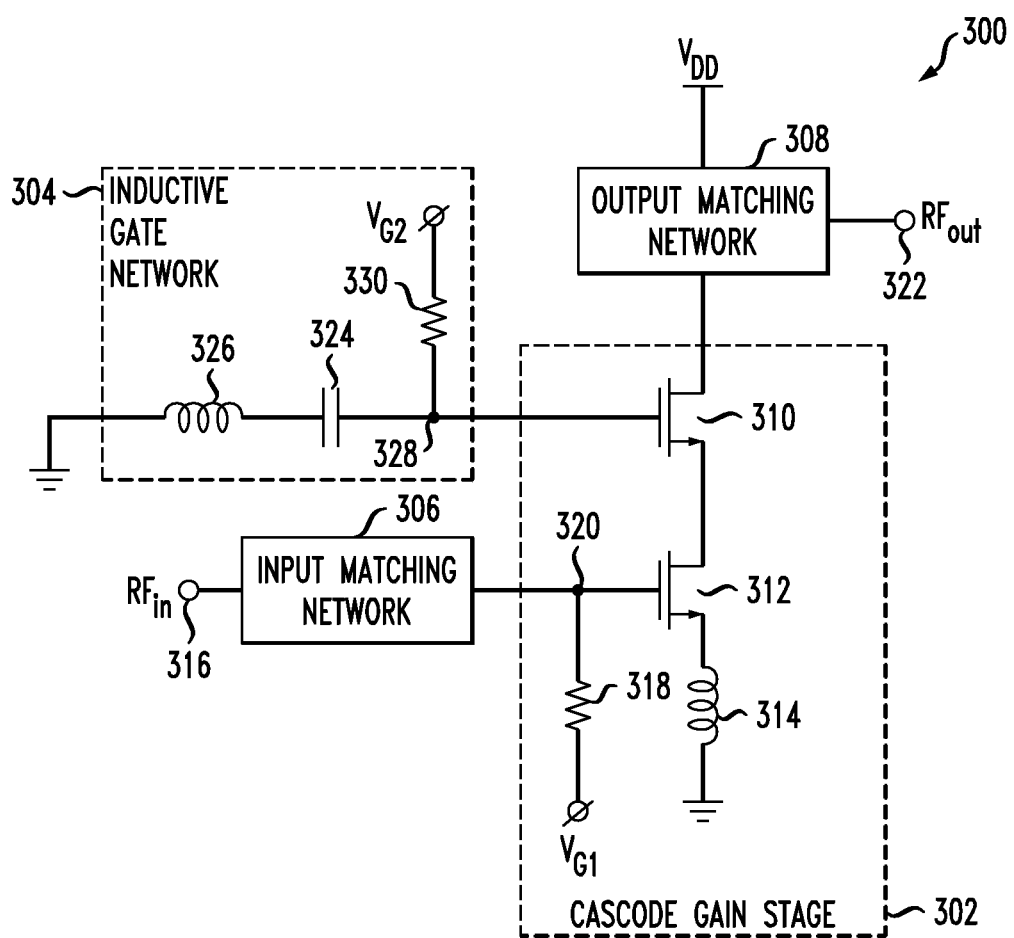
FIG. 3 illustrates a single-stage low-noise amplifier including another example of an inductive gate network.

Turning now to FIG. 3, the inductive gate network 304 includes capacitor 324 coupled in series with inductor 326 and the gate of common gate transistor 310. Resistor 330 is coupled between a voltage source node set at a bias voltage $V_{G2}$ and to node 328, which is located between capacitor 324 and the gate of common gate transistor 310. In the embodiment illustrated in FIG. 3, capacitor 324 blocks the DC voltage and inductor 326 boosts the gain of LNA 300. Like LNA 200A illustrated in FIG. 2A, one or more LNAs 300 may be cascaded to increase the number of stages and overall gain of the LNA. Additionally, one or more of the stages may include an inductive gate network 304 coupled to the gate of a common gate transistor 310.

Figure 4:
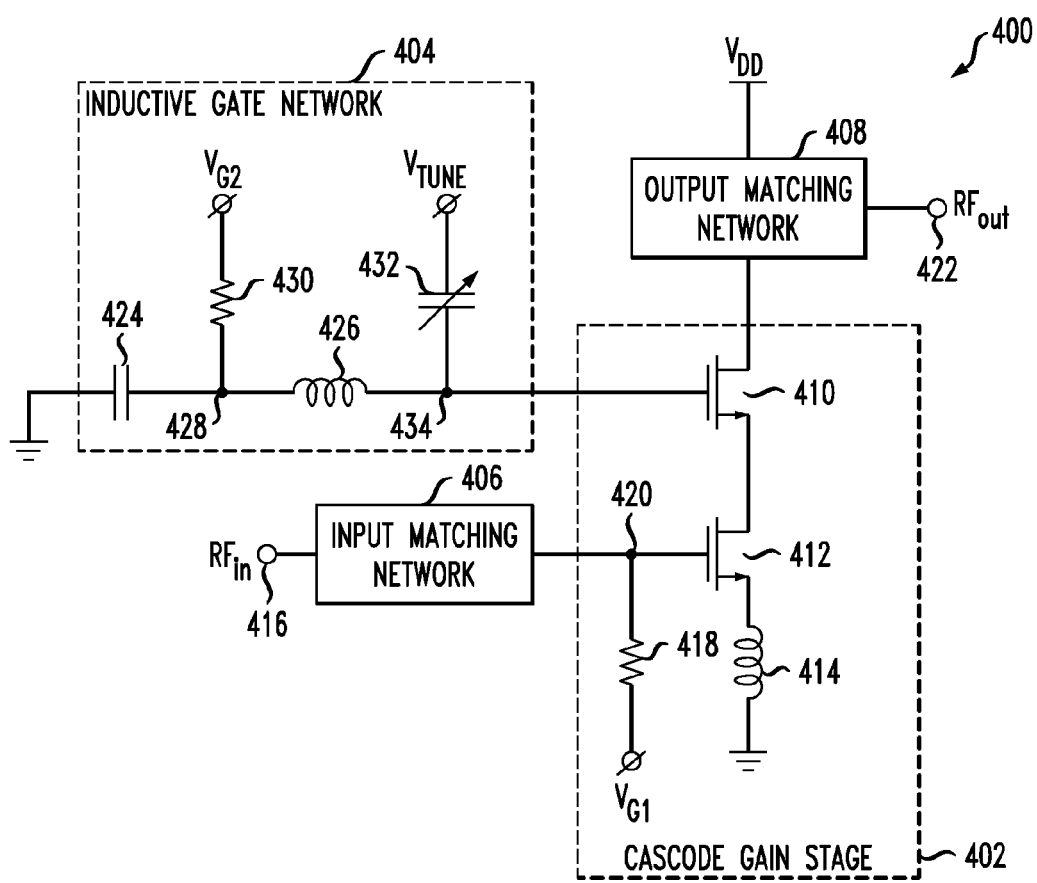
FIG. 4 illustrates a single-stage low-noise amplifier including another example of an inductive gate network.

FIG. 4 illustrates another embodiment of an LNA 400 including an inductive gate network 404 comprising capacitor 424 coupled in series with inductor 426 and the gate of common gate transistor 410. Resistor 430 is coupled between a voltage source node set at a bias voltage $V_{G2}$ and to node 428, which is located between capacitor 424 and inductor 426. A varactor 432 is coupled between a voltage node set at a tuning voltage, $V_{Tune}$, and to node 434, which is disposed between inductor 426 and the gate of common gate transistor 410. Adding varactor 432 in shunt between inductor 426 and the gate of common gate transistor 410 further stabilizes the response of LNA 400. The voltage of $V_{Tune}$ may be varied to tune the capacitance of varactor 432 as will be understood by one skilled in the art. Several LNAs 400 may be cascaded to provide an LNA having a plurality of gain stages with one or more of the stages including an inductive gate network 404 coupled to the gate of common gate transistor 410.

Figure 5:
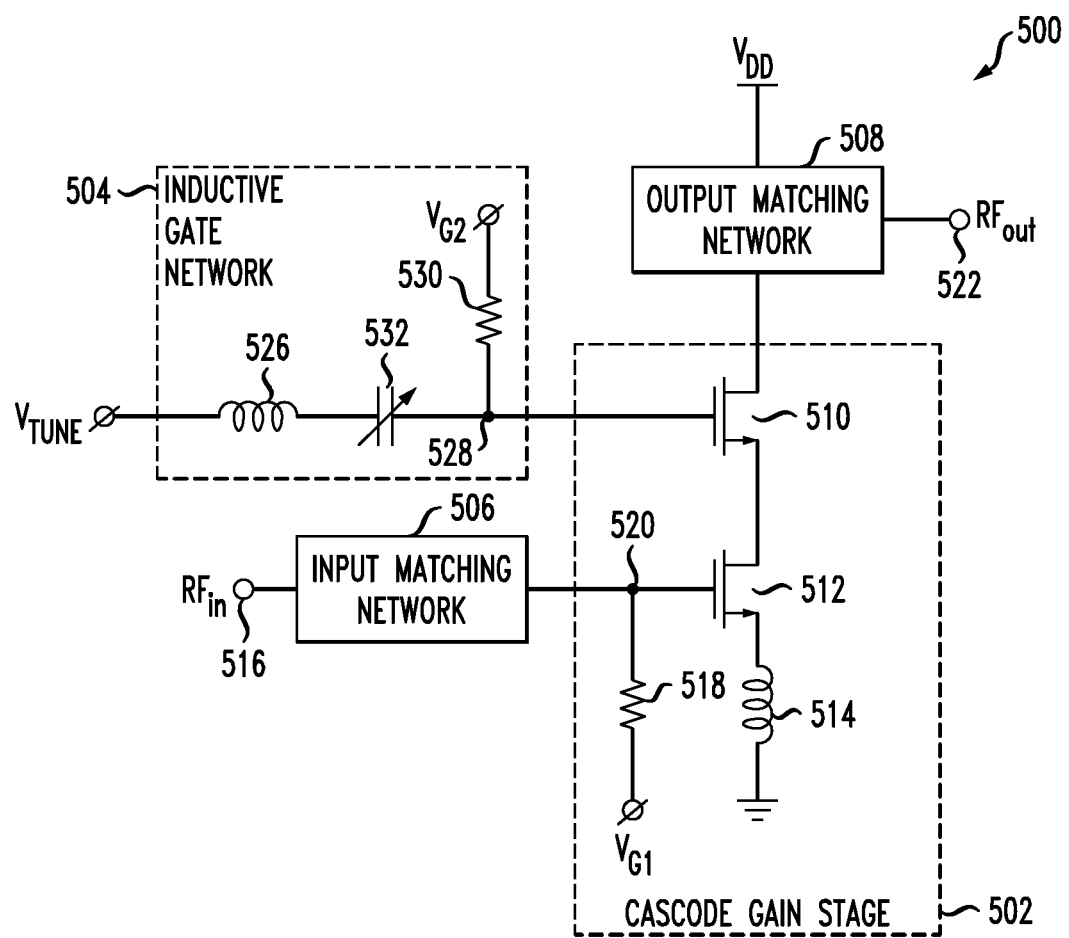
FIG. 5 illustrates a single-stage low-noise amplifier including another example of an inductive gate network.

FIG. 5 illustrates another embodiment of an LNA 500 in which inductive gate network 504 includes inductor 526 is coupled to varactor 532 in series with the gate of transistor 510. Inductive gate network 504 also includes resistor 530 coupled between a voltage source node set at a bias voltage $V_{G2}$ and to node 528, which is located between varactor 532 and the gate of transistor 510 of cascode gain stage 502. The capacitance of varactor 532 may be adjusted by adjusting the voltage of $V_{Tune}$, which is coupled to inductor 526 instead of having inductor 526 coupled to ground. One skilled in the art will understand that LNA 500 may be cascaded to provide an LNA having a plurality of gain stages with at least one of the gain stages including an inductive gate network 504 coupled to transistor 510 of cascode gain stage 502.

Figure 6A:
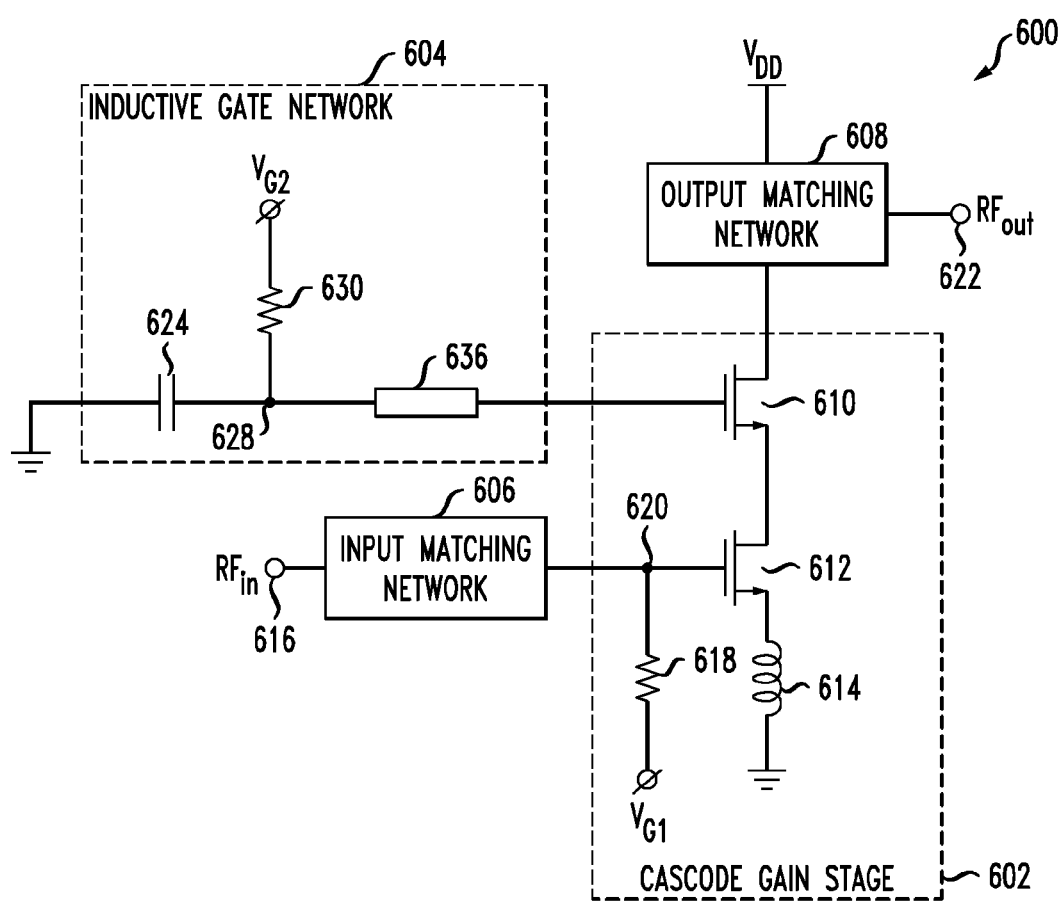
FIG. 6A illustrates a single-stage low-noise amplifier including another example of an inductive gate network.
Figure 6B:
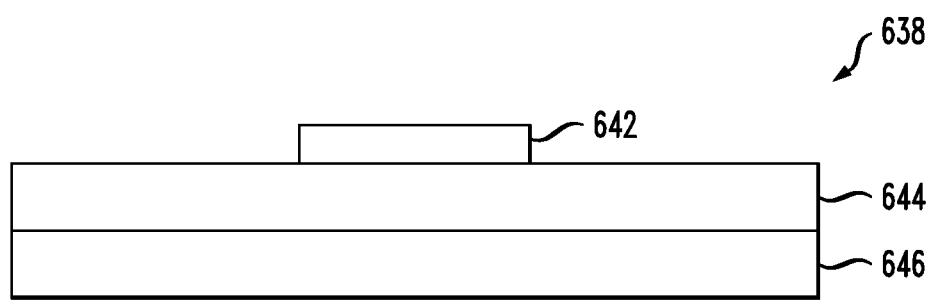
FIGS. 6B and 6C illustrate cross-sectional views of the inductive transmission lines in accordance with the inductive gate network illustrated in FIG. 6A.
Figure 6C:
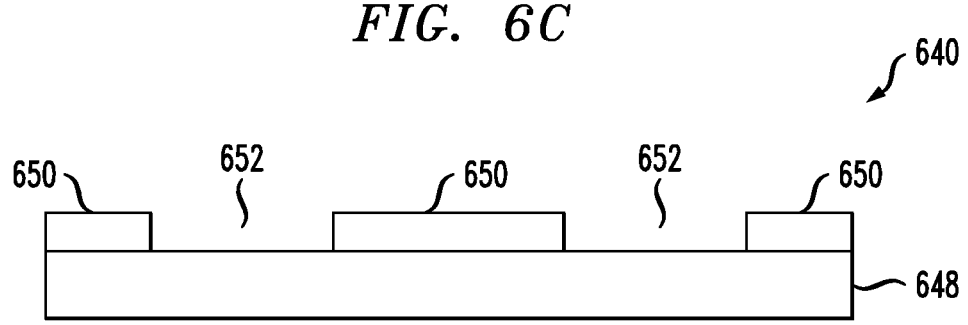

In yet another embodiment illustrated in FIG. 6, the inductive element of inductive gate network 604 may be implemented by an inductive transmission line 636, which may be a microstrip line or a coplanar waveguide. FIGS. 6B and 6C are cross-sectional views of a microstrip line 638 and a coplanar waveguide ("CPW") 640, respectively. As shown in FIG. 6B, microstrip 638 includes a thin conductive strip 642 disposed over a dielectric material 644. A conductive layer 646 is disposed beneath dielectric material 644 and forms a ground plane as will be understood by one skilled in the art. CPW 640 illustrated in FIG. 6C includes a substrate 648 over which a conductive material 650 is formed. A pair of parallel, spaced apart slots 652 are defined by conductive material 650 such that a thin strip that functions as the transmission line is left between slots 652.

Referring again to FIG. 6A, resistor 630 is coupled between bias voltage VG2 and node 628, which is disposed between capacitor 624 and inductive transmission line 636. As described above with respect to FIGS. 3-5, LNA 600 may be cascaded to provide an LNA having a plurality of stages with at least one stage including an inductive gate network coupled to the gate of transistor 610 of cascode gain stage 602.

Figure 7A:
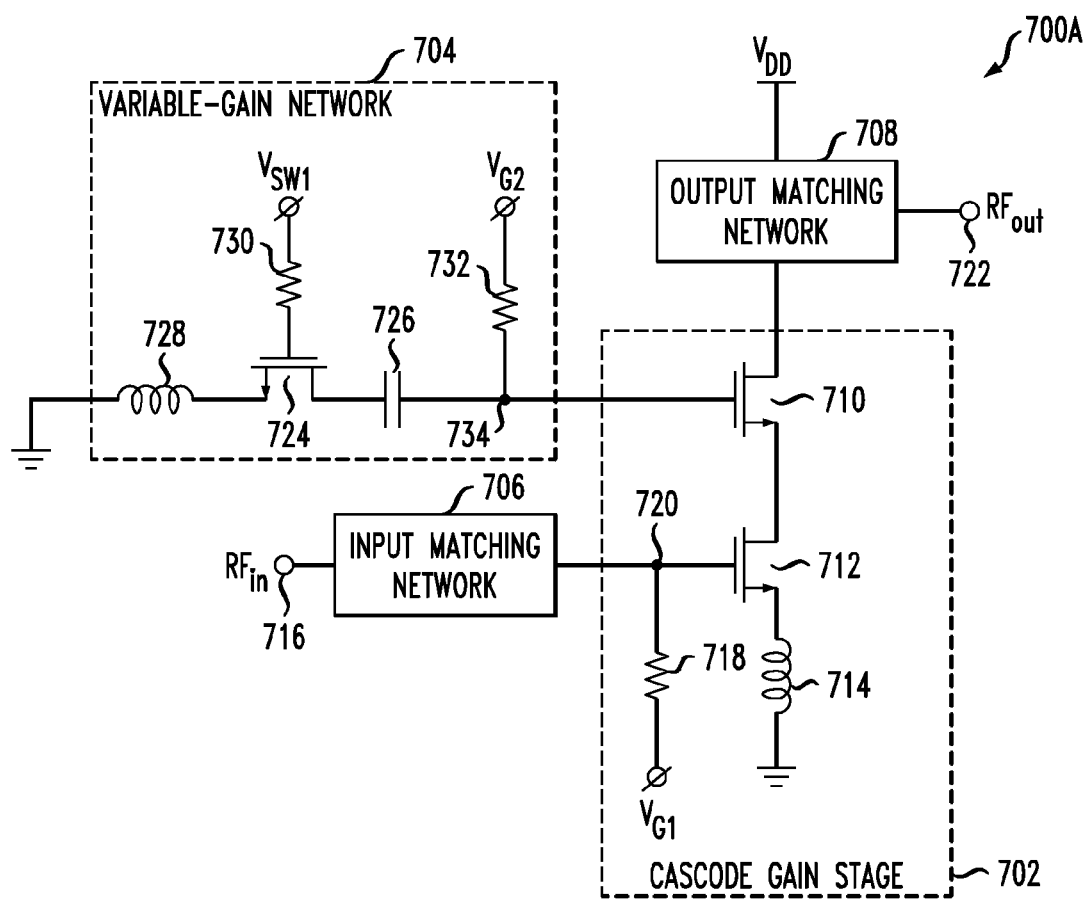
FIG. 7A is a schematic diagram of one example of an improved single-stage low-noise amplifier including a variable gain network.

Active components may be added to the inductive gate network to create a variable gain network such that the gain of the LNA may be varied. For example, FIG. 7A is a block diagram of one example of an improved millimeter-wave low-noise amplifier LNA 700A that advantageously may have a high and low gain modes that are switched based on a strength of a received input signal and exhibits improved stability compared to conventional LNAs. As shown in FIG. 7A, LNA 700A includes a single cascode gain stage 702, a variable gain network 704, an input matching network 706, and an output matching network 708.

Cascode gain stage 702 includes a common gate transistor 710 having its source coupled to a drain of a common source transistor 712, which has its source coupled to ground through inductor 714. The gate of common source transistor 712 is coupled to an input node 716 for receiving RF input signal through input matching network 706. A resistor 718 may be coupled to a voltage source node $V_{G1}$ for biasing the gate voltage of common source transistor 712 and to node 720 disposed between input matching network 706 and the gate of common source transistor 712.

The gate of common gate transistor 710 is coupled to ground through variable gain network 704, and the drain of common gate transistor 710 is coupled to an output node 722 through output matching network 708, which may be coupled to a voltage supply node set at $V_{DD}$. Variable gain network 704 includes a switch 724, which may be a metal-oxide semiconductor ("MOS") transistor having a drain (or source) coupled to the gate of common gate transistor 710 through a capacitor 726. The source (or drain) of MOS transistor switch 724 is coupled to ground through inductor 728, and the gate of transistor 724 is coupled to a control voltage, $V_{SW1}$, through a resistor 730. Another resistor 732 may be disposed between capacitor 726 and the gate of common gate transistor 710 at node 734.

Figure 7B:
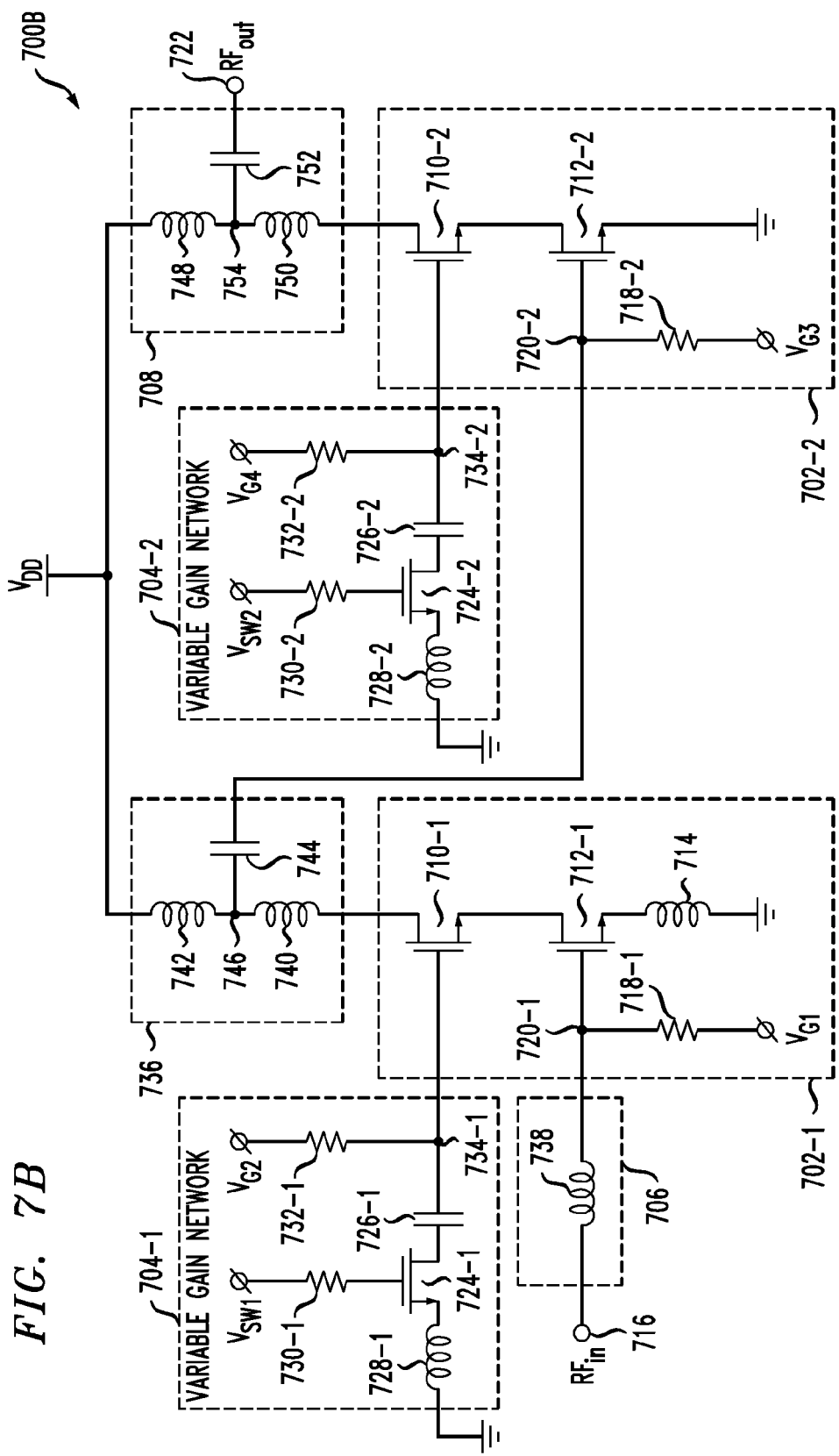
FIG. 7B is a schematic diagram of one example of an improved two-stage low-noise amplifier with each stage including a variable gain network.

The single-stage LNA 700A may be cascaded to provide a multiple stage LNA. For example, FIG. 7B illustrates an LNA 700B having two cascode gain stages 702-1 and 702-2. Each of the cascode gain stages 702-1, 702-2 includes a common-gate transistor 710-1, 710-2 having a source coupled to a drain of a common source transistor 712-1, 712-2. The gates of the common gate transistors 710-1, 710-2 are coupled to ground through a variable gain network 704-1, 704-2.

Common source transistor 712-1 has its source coupled to ground through an inductor 714, and its gate coupled to an input node 716 configured to receive an RF input signal through an input matching network 706. Resistor 718-1 is coupled between a gate biasing voltage $V_{G1}$ and a node 720-1 disposed between the gate of common source transistor 712-1 and the input matching network 706. Common source transistor 712-2 has its source coupled to ground and its gate coupled to inter-stage matching network 736, which is also coupled to the drain of common gate transistor 710-1. A resistor 718-2 is coupled between a biasing voltage $V_{G3}$ and node 720-2, which is disposed between the gate of common source transistor 712-2 and the inter-stage matching network 736.

Each variable gain network 704-1, 704-2 includes a switch 724-1, 724-2 coupled between a gate of common gate transistor 710-1, 710-2 and ground. Switches 724-1, 724-2 may be MOS transistors each having their sources (or drains) coupled to ground through an inductor 728-1, 728-2, their drains (or sources) coupled to the gate of common gate transistor 710-1, 710-2 through a capacitor 726-1, 726-2, and their gates coupled to a respective control voltage $V_{SW1}$, $V_{SW2}$ through a resistor 730-1, 730-2.

Input matching network 706 may include a single inductor 738, although one skilled in the art will understand that input matching network may include a plurality of inductors as well as one or more capacitors to form an LC ladder. Inter-stage matching network 736 includes an LC ladder comprising a first inductor 740 coupled to the drain of common gate transistor 710-1 and a second inductor 742 coupled to the first inductor 740 and to a voltage supply node set at $V_{DD}$. Capacitor 744 is coupled to the gate of common source transistor 712-2 of the second cascode gain stage 702-2 and to node 746, which is disposed between inductors 740 and 742. Output matching network 708 includes an inductor 748 coupled to voltage source node $V_{DD}$ and to another inductor 750, which is coupled to the drain of common gate transistor 710-2. Capacitor 752 is coupled to output node 722 and to node 754, which is disposed between inductors 748 and 750.

Figure 7C:
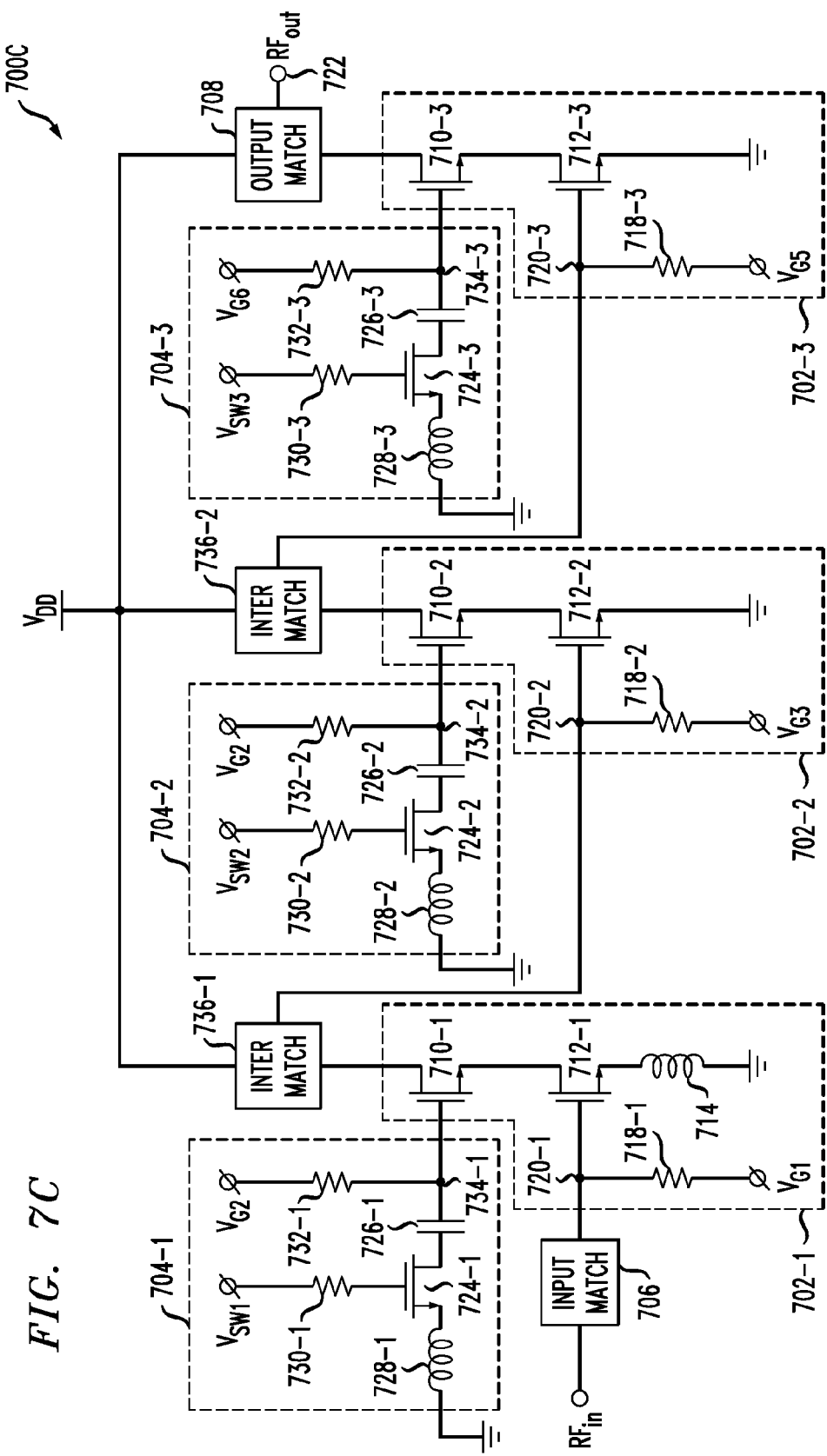
FIG. 7C is a schematic diagram of one example of an improved three-stage low-noise amplifier with each stage including a variable gain network.

One skilled in the art will understand that the number of cascaded cascode stages is not limited to two. For example, FIG. 7C illustrates a three stage LNA 700C including three cascode gain stages 702-1, 702-2, and 702-3 each coupled to a respective variable gain network 704-1, 704-2, and 704-3. The descriptions of components of LNA 700C that are the same as those of LNA 700B are not repeated.

Figure 7D:
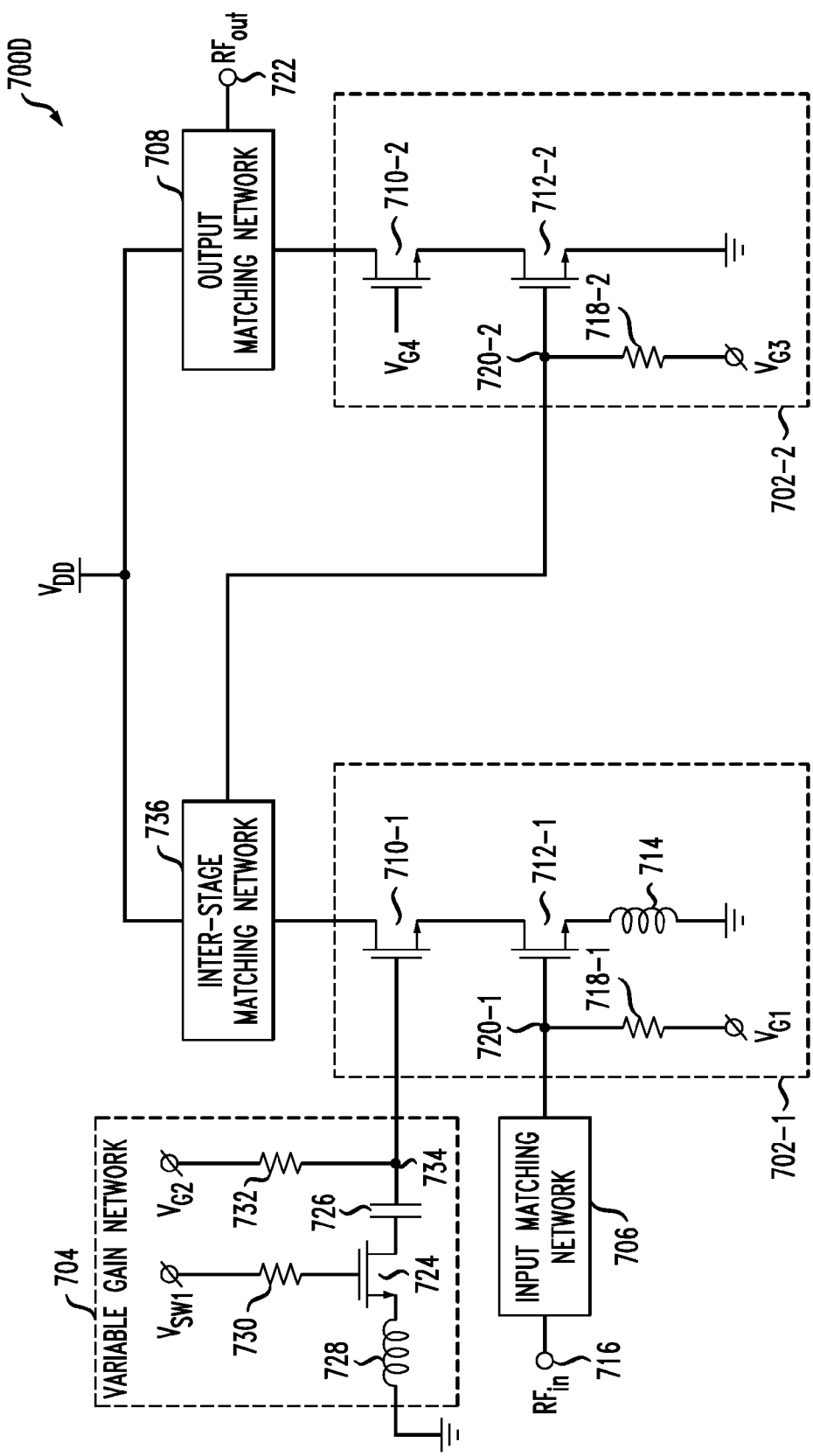
FIG. 7D is a schematic diagram of another example of an improved two-stage low-noise amplifier with only one stage including a variable gain network.
Figure 7E:
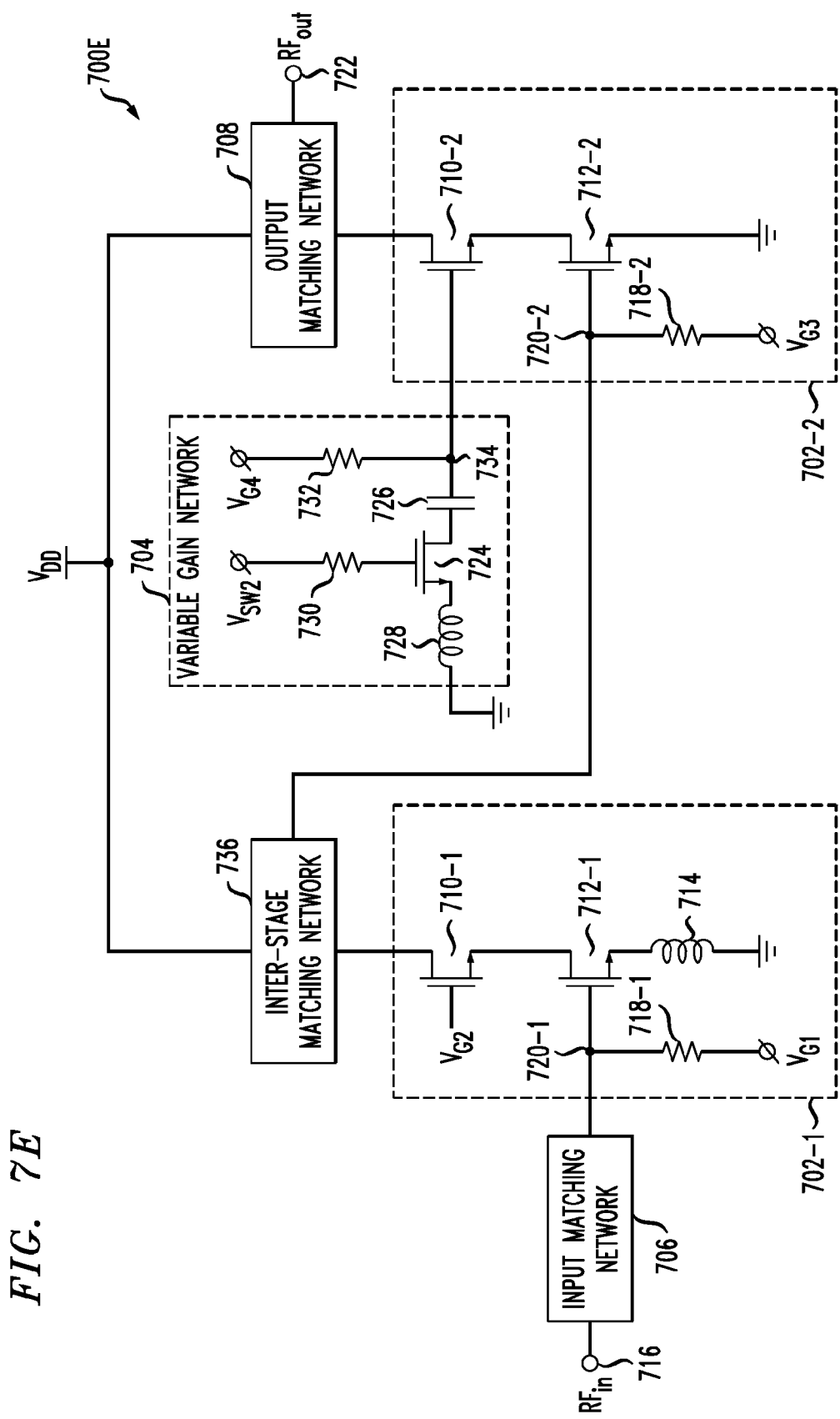
FIG. 7E is a schematic diagram of another example of an improved two-stage low-noise amplifier with only one stage including a variable gain network.

In some embodiments, an improved LNA may be implemented with a plurality of cascode gain stages 702 with only one of the cascode gain stages being coupled to a variable gain network 704. For example, FIG. 7D illustrates one example of an LNA 700D including two cascode gain stages 702-1 and 702-2 with a variable gain network 704 coupled to cascode gain stage 702-1. FIG. 7E illustrates another example of an LNA 700E including two cascode gain stages 702-1 and 702-2 with a variable gain network coupled to cascode gain stage 702-2. Accordingly, one skilled in the art will understand that the number of cascode gain stages 702 and variable gain networks 704 may be varied as may the cascode gain stage 702 to which a variable gain stage 704 may be coupled.

In operation, the single stage LNA 700A receives an input signal at input node 716 and LNA 700A amplifies the received RF signal. Switch 724 of variable gain network 704 selectively couples gain boosting inductor 728 to the gate of common gate transistor 710 for increasing the gain of cascode gain stage 702. The selective coupling of gain boosting inductor 728 to the gate of common gate transistor 710 is controlled by the voltage coupled to the gate of switch 724 through resistor 730.

Figure 8:
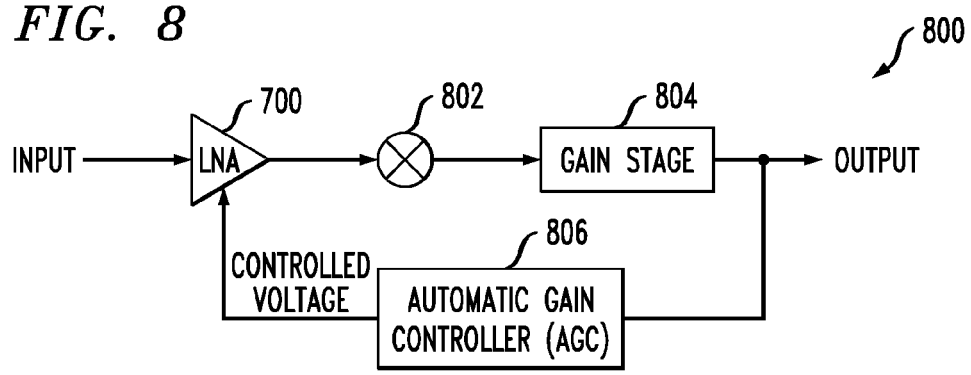
FIG. 8 illustrates one example of a system including a low noise-amplifier having a variable gain network.

The opening and closing of switch 724 may be controlled by a feedback loop 800 as shown in FIG. 8. Feedback loop 800 includes LNA 800, a mixer circuit 802, a gain stage 804, and an automatic gain controller ("AGC") 806. An input of a mixer 802 is coupled to an output of the LNA 700. An output of the mixer 802 is connected to an input of a gain stage 804, which may have a fixed or variable gain. An output of the gain stage 804 is connected to an input of AGC 806, which has its output coupled to another input of the LNA 700. One skilled in the art will understand that additional gain stages or attenuators (not shown) may be provided between the mixer 802 and gain stage 804 and/or gain stage 804 and output of the feedback loop.

In operation, an RF signal is linearly amplified by the LNA 700 and then passed to the mixer 802, which down-converts the linearly amplified RF signal to a baseband frequency. Mixer 802 supplies the down-converted RF signal to gain stage 804, which amplifies the down-converted signal by a predetermined amount and then supplies the amplified signal to AGC 806. The gain of LNA 700 is adjusted by an amount determined by the controlled voltage supplied from AGC 806. AGC 806 receives a feedback signal of the amplified signal from the gain stage 804 and uses the feedback signal to adjust the controlled voltage, and thus, the amount of gain in LNA 700. For example, if the output of the feedback loop is larger than a desired output voltage, then AGC 806 controls the variable gain LNA 700 to decrease the amount of gain, i.e., switch 724 is open. On the other hand, if the output of the feedback loop is smaller than the desired output voltage, then AGC 806 controls the variable gain LNA 806 to increase the amount of gain, i.e., switch 724 is closed.

The finite resistance of switch 724 when it couples gain boosting inductor 728 to the gate of common gate transistor 710 advantageously enhances the stability of the LNA. Capacitor 726 blocks direct current (DC) voltages and assists in biasing the gate terminal of common gate transistor 710 and switch 724 for controlling the coupling of inductor 728 to the gate of transistor 710. Inductor 714 coupled to the source of common source transistor 712 enables input and noise matching to be obtained. When the voltage applied to the gate of switch 724 is below the threshold voltage and the switch is open, the switch 724 has a large resistance that reduces the gain of cascode gain stage 702.

In multi-stage LNAs 700B, 700C having a plurality of variable gain networks 704, each of the switches 724 may be individually controlled by an AGC 806 to selectively couple a gain boosting inductor 728 to the gate of a common gate transistor 710. Additionally, the values of the components of the variable gain networks 704 may differ from one another such that the gain added by coupling a first gain boosting inductor 728 to the gate of a first common gate transistor 710 may differ from the gain added by coupling a second gain boosting inductor 728 to the gate of a second common gate transistor 710.

For example, LNA 700B may have four different operating modes: a low gain operating mode when switches 724-1 and 724-2 are open such that gain boosting inductors 728-1 and 728-2 are not coupled to the gate of common gate transistors 710-1 and 710-2; a first medium-gain mode in which switch 724-1 is closed and switch 724-2 is open such that gain boosting inductor 728-1 is coupled to the gate of common gate transistor 710-1; a second medium-gain mode in which switch 724-2 is closed and switch 724-1 is open such that gain boosting inductor 728-2 is coupled to the gate of common gate transistor 710-2; and a high gain mode in which both switches 724-1 and 724-2 are closed such that gain boosting inductors 728-1 and 728-2 are coupled to the gates of common gate transistors 710-1 and 710-2.

Figure 9A:
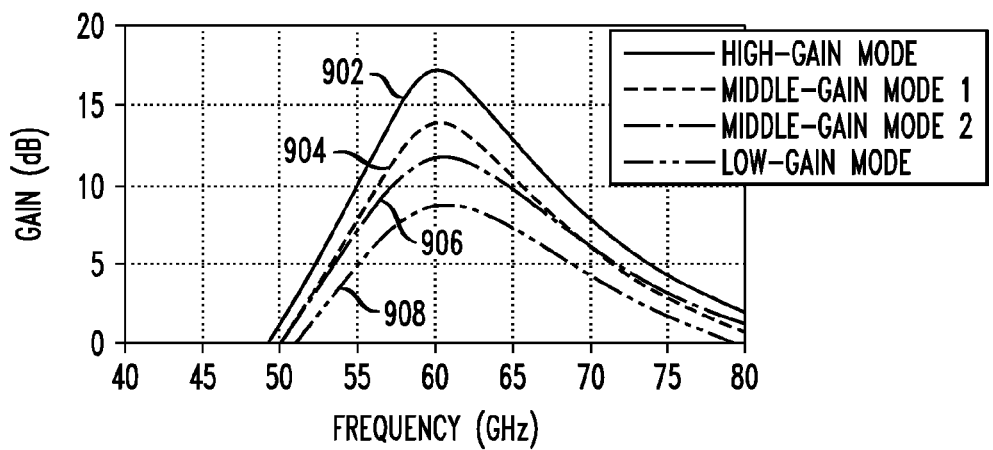
FIGS. 9A-9D illustrate various simulation results of a low-noise amplifier in accordance with FIG. 7B.
Figure 9B:
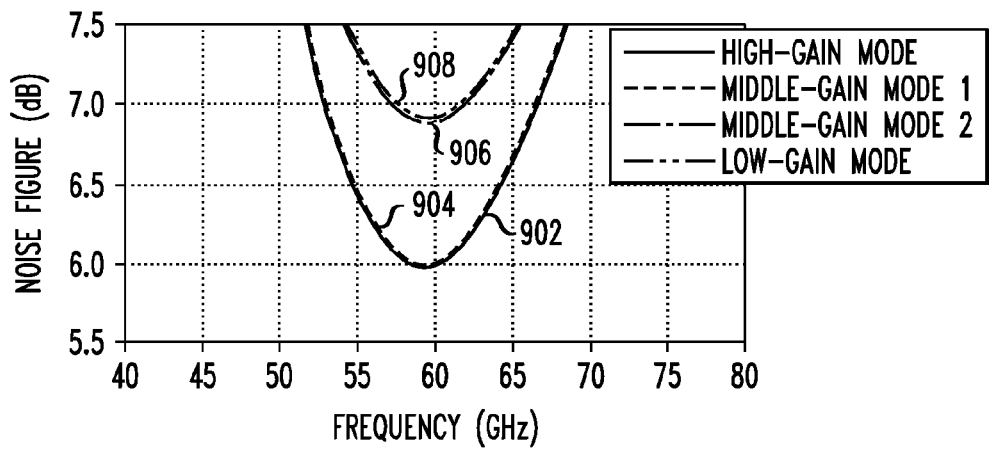
Figure 9C:
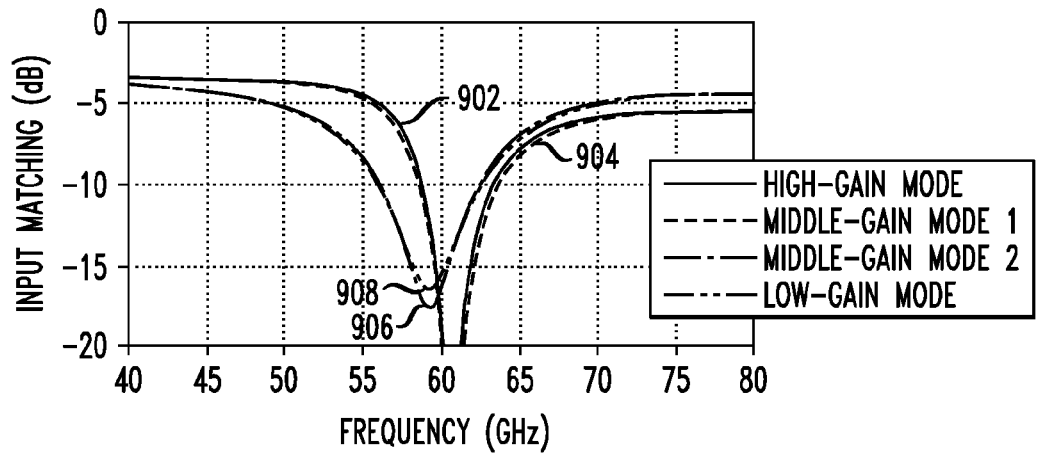
Figure 9D:
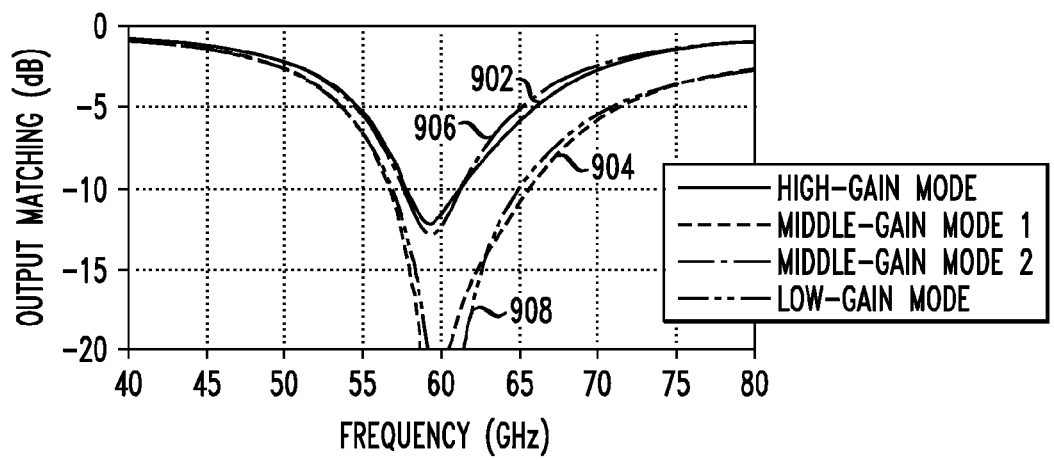

FIGS. 9A-9D illustrate various simulation results of the operation of an LNA 700B in accordance with FIG. 7B. Specifically, FIG. 9A is a graph illustrating the gain of LNA 700B in high-gain mode 902, a first medium-gain mode 904, a second medium-gain mode 906, and low-gain mode 908. As shown in FIGS. 9A-9D, the gain of the simulated LNA 700B in the high-gain mode 902 is 17.2 dB and the noise figure is 6 dB while the input and output matching are both smaller than −10 dB. In the low-gain mode, the simulated LNA 700B is 8.7 dB and the noise figure is 6.9 dB while the input and output matching are still both smaller than −10 dB. The simulation was performed with an input signal having a frequency of 60 GHz with inductors 728-1 and 728-2 having inductances of 60 pH and NMOS transistors 724-1 and 724-2 having lengths of 128 μm and widths of 60 nm. One skilled in the art will understand that the RF input signal and inductors 728-1 and 728-2 may have different values as may the lengths and widths of NMOS transistors 724-1 and 724-2.

Figure 10A:
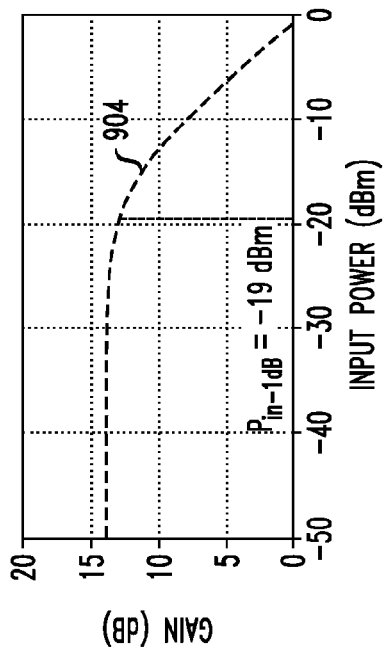
FIGS. 10A-10D illustrate the simulated linearity of a low-noise amplifier in accordance with FIG. 7B.
Figure 10B:
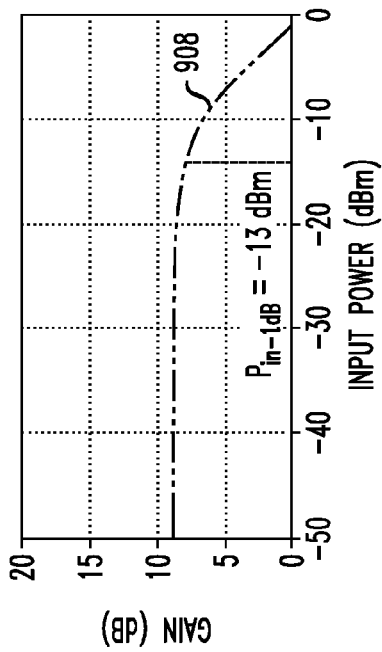
Figure 10C:
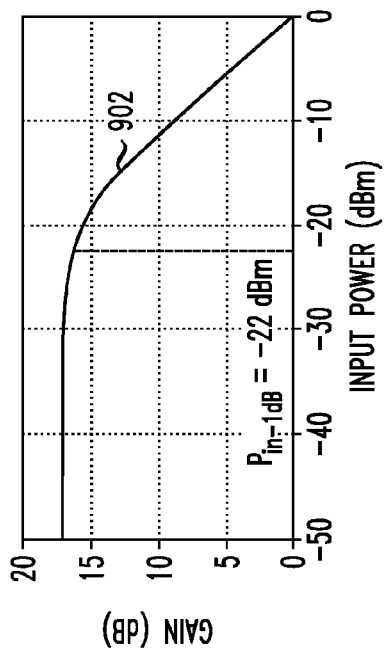
Figure 10D:
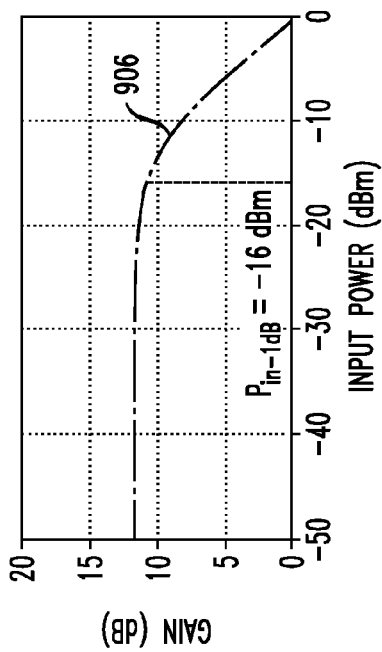

FIGS. 10A-10B are graphs illustrating the linearity (Pin-1 dB) of the LNA 700B for each of the operating modes 902-908. While the simulated LNA 700B demonstrates a 1 dB difference in noise figure between the high-gain mode 902 and the low-gain mode 908, the linearity is dramatically altered by 9 dB (−22 dBm to −13 dBm) as illustrated in FIGS. 10A-10D, which results at high linearity performance at the low-gain mode. Additionally, high sensitivity can be obtained in the high-gain mode since the gain is varied by 8.5 dB from the low-gain to high-gain mode with the variation of noise figure of 1 dB.

Figure 11:
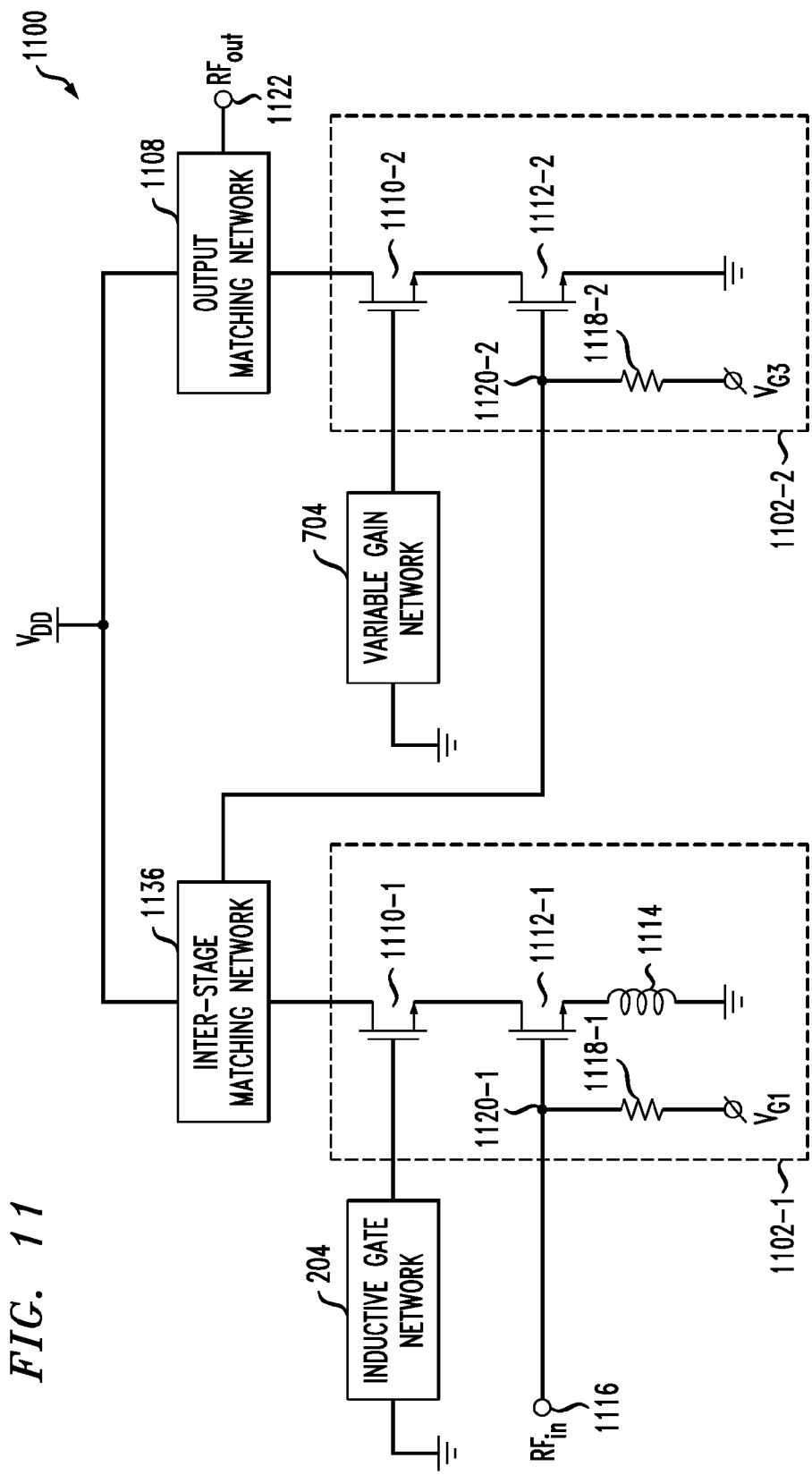
FIG. 11 illustrates one example of a two-stage low-noise amplifier with one stage including a passive inductive gate network and the other stage including an active variable gain network.

The inductive gate networks utilizing passive circuit elements may be implemented in an LNA that also includes a variable gain network including an active circuit element. For example, FIG. 11 illustrates a two-stage LNA 1100 including an inductive gate network 204 coupled to common gate transistor 1110-1 of a first cascode gain stage 1102-1 and a variable gain network 704 coupled to the common gate transistor 1110-2 of the second cascode gain stage 1102-2. The rest of the circuit elements having the most significant digits "11" are similar to those described above with respect to FIGS. 2A-2E and 7A-7E and detailed descriptions are not repeated.

In some embodiments, a low-noise amplifier ("LNA") includes a first cascode gain stage including a first complementary metal oxide semiconductor ("CMOS") transistor configured to receive a radio frequency ("RF") input signal and a second CMOS transistor coupled to an output node. The first inductive gate network is coupled to a gate of the second CMOS transistor for increasing a gain of the first cascode gain stage. The first inductive gate network has a non-zero inductive input impedance and includes at least one passive circuit element.

In some embodiments, a low-noise amplifier ("LNA") includes a plurality of cascode gain stages for increasing an amplitude of a radio frequency ("RF") input signal. Each of the cascode gain stages includes a first transistor having a source coupled to ground and a gate coupled an input node of the respective gain stage for receiving an RF input signal to the respective gain stage. A second transistor has a source coupled to a drain of the first transistor and a drain coupled to an output node of the respective gain stage. At least one inductive gate network has a non-zero input impedance and includes at least one passive circuit element coupled to a gate of the second transistor in at least one of the plurality of cascode gain stages.

In some embodiments, a method includes receiving a first radio frequency ("RF") signal at an input node for a first cascode gain stage. A first inductive gate network having a non-zero input impedance and at least one passive circuit device is coupled to a gate of a first common gate transistor of the first cascode gain stage. An amplitude of the first RF signal is increased at the first cascode gain stage to produce a second RF signal. The second RF signal having an amplitude greater than an amplitude of the first RF signal is output to an output node of the first cascode gain stage coupled to the first common gate transistor.

The disclosed circuits and methods disclosed herein advantageously increase the gain performance of an LNA. Various inductive gate networks having an input impedance may implemented using passive components and be coupled to the gate of a common gate transistor in a cascode gain stage to increase the performance of the cascode gain stage without increasing the power consumption of the LNA. Variable gain networks may also be coupled to a gate of the common gate transistor provide flexibility in the amount of gain provided by the LNA.

Although the disclosed circuits and methods have been described in terms of exemplary embodiments, it is not limited thereto. Rather, the appended claims should be construed broadly, to include other variants and embodiments of the circuits and methods, which may be made by those skilled in the art without departing from the scope and range of equivalents of the circuits and methods.

What is claimed is:

1. A low-noise amplifier ("LNA"), comprising:
   a first cascode gain stage including a first complementary metal oxide semiconductor ("CMOS") transistor configured to receive a radio frequency ("RF") input signal and a second CMOS transistor coupled to an output node;
   a first inductive gate network coupled to a gate of the second CMOS transistor for increasing a gain of the first cascode gain stage, the first inductive gate network having a non-zero inductive input impedance and including at least one passive circuit element;
   a second cascode gain stage coupled to the first cascode gain stage; and
   a first variable gain network coupled to a gate of a first transistor of the second cascode gain stage that is coupled to a second transistor of the second cascode gain stage, the first variable gain network including
      an inductor for boosting a gain of the second cascode gain stage,
      a capacitor coupled to the inductor for blocking a direct current ("DC") voltage, and
      a third transistor coupled to the inductor and to the capacitor, the third transistor configured to selectively couple the inductor to the second cascode stage in response to a control signal received at a gate of the third transistor to increase an inductance at the gate of the first transistor of the first variable gain network.

2. The LNA of claim 1, wherein the inductive gate network includes one of a capacitor or a varactor for filtering a direct current ("DC") voltage.

3. The LNA of claim 1, wherein the at least one passive circuit element includes an inductor or an inductive transmission line.

4. The LNA of claim 3, wherein the passive transmission line includes one of a microstrip or a coplanar waveguide.

5. The LNA of claim 1, further comprising:
   an input matching network coupled between the input node and the first cascode gain stage.

6. The LNA of claim 1, further comprising:
   a first inter-stage matching network coupled to an output of the first cascode gain stage and to an input of the second cascode gain stage.

7. The LNA of claim 1, wherein the first CMOS transistor has a source coupled to ground and a drain coupled to a source of the second CMOS transistor, and the second CMOS transistor has a drain coupled to the output node.

8. A low-noise amplifier ("LNA"), comprising:
   a plurality of cascode gain stages for increasing an amplitude of a radio frequency ("RF") input signal, each of the cascode gain stages including
      a first transistor having a source coupled to ground and a gate coupled an input node of the respective gain stage for receiving an RF input signal to the respective gain stage, and
      a second transistor having a source coupled to a drain of the first transistor and a drain coupled to an output node of the respective gain stage;
   at least one inductive gate network having a non-zero input impedance and including at least one passive circuit element coupled to a gate of the second transistor in at least one of the plurality of cascode gain stages; and
   at least one variable gain network coupled to a gate of the second transistor in at least one of the plurality of cascode gain stages, the at least one variable gain network including
      an inductor for boosting a gain of the cascode gain stage to which the at least one variable gain network is coupled,
      a capacitor coupled to the inductor for blocking a direct current ("DC") voltage, and
      a third transistor coupled to the inductor and to the capacitor, the third transistor configured to selectively couple the inductor to the gate of the second transistor of the cascode gain stage to which the at least one variable gain network is coupled in response to a control signal received at a gate of the third transistor to increase an inductance at the gate of the second transistor of the cascode gain stage to which the at least one variable gain network is coupled.

9. The LNA of claim 8, wherein the at least one passive circuit element includes one of an inductor or an inductive transmission line.

10. The LNA of claim 9, wherein the inductive transmission line includes one of a microstrip or a coplanar waveguide.

11. The LNA of claim 8, wherein the inductive gate network includes one of a capacitor or a varactor for removing a direct current ("DC") bias voltage from the inductive gate network.

12. A method, comprising:
receiving a first radio frequency ("RF") signal at an input node for a first cascode gain stage, a first inductive gate network having a non-zero input impedance and at least one passive circuit device is coupled to a gate of a first common gate transistor of the first cascode gain stage;
increasing an amplitude of the first RF signal at the first cascode gain stage to produce a second RF signal;
outputting the second RF signal having an amplitude greater than an amplitude of the first RF signal to an output node of the first cascode gain stage coupled to the first common gate transistor
receiving the second RF signal at an input node for a second cascode gain stage;
selectively coupling a variable gain network to a gate of a second common gate transistor of the second cascode gain stage in response to receiving a control signal at a gate of a third transistor to increase an impedance at the gate of the second transistor thereby further increasing the amplitude of the second RF signal to produce a third RF signal.

13. The method of claim 12, wherein the passive circuit device of the first inductive gate network includes at least one of an inductor, a capacitor, a varactor, or an inductive transmission line.

14. The method of claim 13, wherein the inductive transmission line includes at least one of a microstrip or a coplanar waveguide.

15. The method of claim 12, further comprising:
receiving the third RF signal at an input node for a third cascode gain stage, the third cascode gain stage having a second inductive gate network having a non-zero input impedance coupled to a third common gate transistor in the second cascode gain stage;
increasing an amplitude of the third RF signal at the third cascode gain stage to produce a fourth RF signal; and
outputting the fourth RF signal having an amplitude greater than the amplitude of the third RF signal to an output node for the third gain stage coupled to the third common gate transistor.

16. The method of claim 12, further comprising:
receiving a third fourth RF signal at an input node for a third cascode gain stage;
selectively coupling a variable gain network to a gate of a third common gate transistor of the third cascode gain stage to increase an amplitude of the third RF signal and produce the first RF signal; and
outputting the first RF signal having an amplitude greater than the amplitude of the third RF signal to the input node for the first input gain stage.

17. The method of claim 16, wherein the variable gain network is selectively coupled to the gate of the second common gate transistor through a switch.

18. A method, comprising
receiving a first radio frequency ("RF") signal at an input node for a first cascode gain stage,
selectively coupling a variable gain network to a gate of a first common gate transistor of the first cascode gain stage in response to receiving a control signal at a gate of a transistor to increase an impedance at the gate of the first common gate transistor thereby increasing the amplitude of the first RF signal to produce a second RF signal;
increasing an amplitude of the second RF signal at a second cascode gain stage to produce a third RF signal, the second cascode gain stage including a second common gate transistor to which a first inductive gate network is coupled, the first inductive gate network having a non-zero input impedance and at least one passive circuit device coupled to the gate of the second common gate transistor of the second cascode gain stage; and
outputting the third RF signal having an amplitude greater than an amplitude of the second RF signal to an output node of the second cascode gain stage coupled to the second common gate transistor.

19. The method of claim 18, further comprising:
receiving the third RF signal at an input node for a third cascode gain stage, the third cascode gain stage having a second inductive gate network having a non-zero input impedance coupled to a third common gate transistor in the second cascode gain stage;
increasing an amplitude of the third RF signal at the third cascode gain stage to produce a fourth RF signal; and
outputting the fourth RF signal having an amplitude greater than the amplitude of the third RF signal to an output node for the third gain stage coupled to the third common gate transistor.

\* \* \* \* \*

UNITED STATES PATENT AND TRADEMARK OFFICE
CERTIFICATE OF CORRECTION

PATENT NO. : 8,427,240 B2  
APPLICATION NO. : 12/968342  
DATED : April 23, 2013  
INVENTOR(S) : Hsieh-Hung Hsieh et al.

It is certified that error appears in the above-identified patent and that said Letters Patent is hereby corrected as shown below:

In the Claims:

Claim 1, Column 10, Line 3, after "cascode", insert -- gain --.

Signed and Sealed this  
Twenty-sixth Day of November, 2013

Margaret A. Focarino  
*Commissioner for Patents of the United States Patent and Trademark Office*